(12) United States Patent
Ku

(10) Patent No.: US 10,600,493 B2
(45) Date of Patent: Mar. 24, 2020

(54) SEMICONDUCTOR DEVICE INCLUDING MULTIPLE-INPUT SHIFT REGISTER CIRCUIT

(71) Applicant: SK hynix Inc., Gyeonggi-do (KR)

(72) Inventor: Young-Jun Ku, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/210,823

(22) Filed: Dec. 5, 2018

(65) Prior Publication Data

US 2019/0371423 A1 Dec. 5, 2019

(30) Foreign Application Priority Data

May 31, 2018 (KR) .................. 10-2018-0062488

(51) Int. Cl.
 *G11C 29/20* (2006.01)
 *G11C 19/28* (2006.01)
 *G11C 7/10* (2006.01)

(52) U.S. Cl.
 CPC .......... *G11C 19/287* (2013.01); *G11C 7/1069* (2013.01)

(58) Field of Classification Search
 CPC ..................... G11C 19/287; G11C 7/1069

USPC .......................................................... 365/174
See application file for complete search history.

(56) References Cited

U.S. PATENT DOCUMENTS 6,769,084 B2 * 7/2004 Kim .................. G11C 29/20
 711/200
8,437,200 B1 5/2013 Tan et al.

FOREIGN PATENT DOCUMENTS

KR 1020000013809 3/2000

* cited by examiner

*Primary Examiner* — Xiaochun L Chen
(74) *Attorney, Agent, or Firm* — IP & T Group LLP

(57) ABSTRACT

A semiconductor device includes a mode control circuit suitable for selectively masking first and second initial input control signals and an initial feedback signal depending on a mode control signal and outputting first and second input control signals and a feedback signal; and a multiple-input shift register (MISR) circuit including a plurality of input selectors and a plurality of registers which are alternatively coupled in series with one another, wherein each of the plurality of input selectors combines an output signal of a previous stage register among the plurality of registers and an external input signal depending on the first and second input control signals and the feedback signal and provides an input signal for a next stage register among the plurality of registers.

22 Claims, 7 Drawing Sheets

FIG. 2

| M1 | M0 | FUNCTION |
|----|----|----------|
| 0  | 0  | RESET    |
| 0  | 1  | LFSR     |
| 1  | 0  | REGISTER |
| 1  | 1  | MISR     |

SEMICONDUCTOR DEVICE INCLUDING MULTIPLE-INPUT SHIFT REGISTER CIRCUIT

CROSS-REFERENCE TO RELATED APPLICATION

This application claims priority under 35 U.S.C. § 119 to Korean Patent Application No. 10-2018-0062488, filed on May 31, 2018, the disclosure of which is incorporated herein by reference in its entirety.

BACKGROUND

1. Field

Various embodiments relate to a semiconductor design technique, and more particularly, to a semiconductor device including a multiple-input shift register (MISR) circuit.

2. Description of the Related Art

The degree of integration of semiconductor devices continues to improve. Moreover, semiconductor devices have been diversified into different structures, e.g., a multi-chip structure and a system-on-chip (SoC) structure. In the multi-chip structure, a plurality of chips are packaged into one. In the SoC structure, a system is implemented as a single chip.

A high bandwidth memory (HBM) is being developed as a next-generation graphic memory as a substitute for a graphic double data rate 5 (DDR5) synchronous dynamic random access memory (SDRAM), a wide input-output memory, and the like. The HBM may provide a multiple-input shift register or multiple-input signature register (MISR) logical operation to test and train a link with a host device. For the MISR logical operation, the HBM may include a shift register circuit which forms a feedback loop and has multiple input terminals.

The shift register circuit may receive and compress input data from the host device and generate test result data. The test result data may be provided to the host device and be compared with an expected value stored in the host device. When there is a discrepancy between the test result data and the expected value, the host device may transmit again input data with a corrected timing condition. Through such training, the host device may find a proper transmission condition or may replace a defective link with a redundant link.

SUMMARY

Various embodiments are directed to a semiconductor device capable of performing a read operation for an embedded core test using registers included in a multiple-input shift register (MISR) circuit.

In accordance with an embodiment, a semiconductor device includes: a mode control circuit suitable for selectively masking first and second initial input control signals and an initial feedback signal depending on a mode control signal and outputting first and second input control signals and a feedback signal; and a multiple-input shift register (MISR) circuit including a plurality of input selectors and a plurality of registers which are alternatively coupled in series with one another, wherein each of the plurality of input selectors combines an output signal of a previous stage register among the plurality of registers and an external input signal depending on the first and second input control signals and the feedback signal and provides an input signal for a next stage register among the plurality of registers.

In accordance with an embodiment, a memory system includes: a memory controller; and a stack type memory device including a base die and a plurality of core dies which are stacked on the base die to transmit signals through a plurality of through-electrodes, wherein the base die comprises: a mode control circuit suitable for selectively masking first and second initial input control signals and an initial feedback signal depending on a mode control signal, and outputting first and second input control signals and a feedback signal; and a multiple-input shift register (MISR) circuit including a plurality of input selectors and a plurality of registers which are alternatively coupled in series with one another, and suitable for selectively performing an MISR logical operation or a register read operation depending on the first and second input control signals and the feedback signal.

In accordance with an embodiment, a semiconductor device includes: a mode control circuit suitable for generating at least one control signal based on a mode signal; and a register circuit including a plurality of stages including a first stage, a second stage and a third stage coupled in series; wherein, in response to the control signal having a first level, the third stage receives and stores read data of the semiconductor device, and output the stored read data as third data to the second stage, the second stage receives and stores the third data from the third stage, and output the stored third data as second data to the first stage, and the first stage receives and stores the second data from the second stage, and output the stored second data as first data to a test pad; and wherein, in response to the control signal having a second level, the third stage receives and combines a first output signal from the first stage and a third external input signal, and outputs a third output signal, the second stage receives and combines the third output signal from the third stage and a second external input signal, and outputs a second output signal, and the first stage receives and combines the second output signal and a first external input signal, and outputs the first output signal.

BRIEF DESCRIPTION OF THE DRAWINGS

FIG. 2 is a truth table illustrating an operation of an MISR circuit, such as that shown in FIG. 1.

DETAILED DESCRIPTION

Various embodiments will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the disclosure. Also, throughout the specification, reference to "an embodiment" or the like is not necessarily to only one embodiment, and different references to any such phrase are not necessarily to the same embodiment(s).

Moreover, it is noted that the terminology used herein is for the purpose of describing the embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through one or more intermediate components. Communication between two elements, whether direct or indirectly connected/coupled, may be wired or wireless, unless the context indicates otherwise.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the present disclosure.

The drawings are not necessarily to scale and, in some instances, proportions may have been exaggerated in order to clearly illustrate features of the embodiments.

Figure 1:
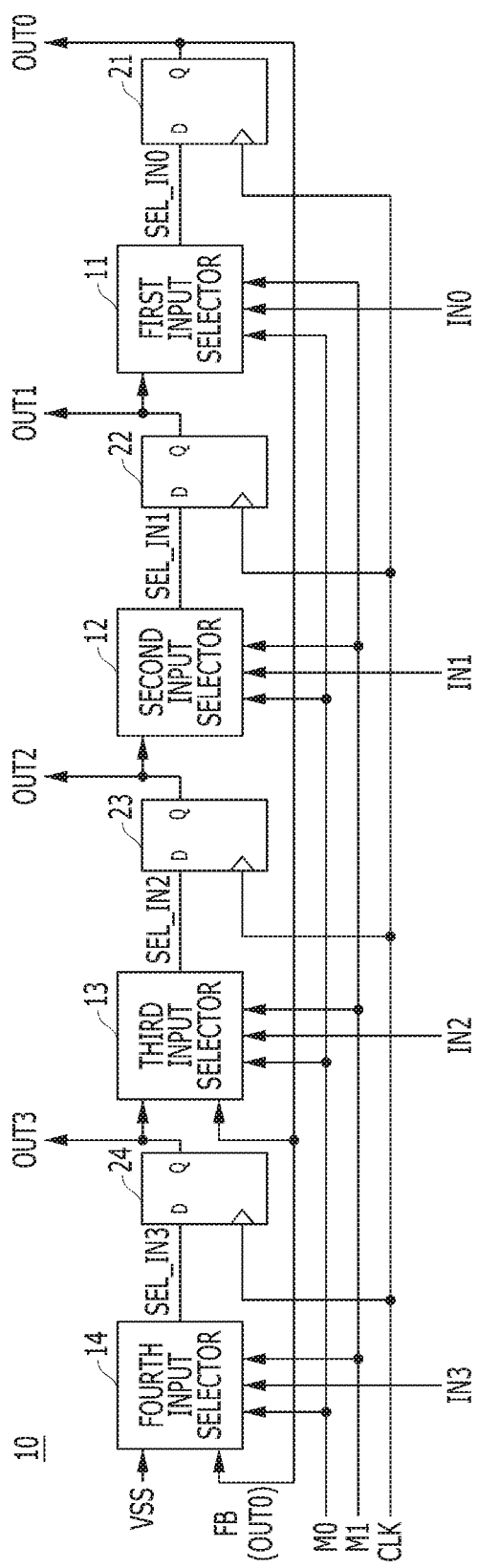
FIG. 1 is a block diagram illustrating a multiple-input shift register (MISR) circuit.

FIG. 1 is a block diagram illustrating a multiple-input shift register (MISR) circuit 10. FIG. 2 is a truth table for depicting an aspect of the operation of the MISR circuit 10.

Referring to FIG. 1, the MISR circuit 10 may include a plurality of input selectors and a plurality of flip-flops which are alternatively coupled in series with one another. The plurality of input selectors may respectively correspond to the plurality of flip-flops. For example, the MISR circuit 10 includes first to fourth input selectors 11 to 14 and first to fourth flip-flops 21 to 24 to store and output four bits. First to fourth output signals OUT0 to OUT3 are outputted from the output terminals of the first to fourth flip-flops 21 to 24, respectively. The first output signal OUT0 is outputted last among the first to fourth output signals OUT0 to OUT3 and is provided as a feedback signal FB to the third input selector 13 and the fourth input selector 14. Since the third input selector 13 and the fourth input selector 14 receive the feedback signal FB, the MISR circuit 10 may be described mathematically by a polynomial: $f(x)=X^4+X^3+1$.

The first to fourth input selectors 11 to 14 may output first to fourth selection signals SEL_IN0 to SEL_IN3, respectively. The first to fourth input selectors 11 to 14 may combine the first to fourth output signals OUT0 to OUT3 which are outputted from previous stage flip-flops and first to fourth external input signals IN0 to IN3, based on first and second input control signals M0 and M1 and the feedback signal FB. For example, the third input selector 13 may output the third selection signal SEL_IN2 by combining the fourth output signal OUT3 outputted from the fourth flip-flop 24 and the third external input signal IN2, based on the first and second input control signals M0 and M1 and the feedback signal FB. The fourth input selector 14 is positioned at the foremost stage of the serial coupling. The fourth input selector 14 may receive a signal of the level of a ground voltage VSS as the output signal of a previous stage flip-flop. The first to fourth selection signals SEL_IN0 to SEL_IN3 may be provided as input signals of corresponding flip-flops.

The first to fourth flip-flops 21 to 24 may store the first to fourth selection signals SEL_IN0 to SEL_IN3 provided from corresponding input selectors, and output the values stored therein as the first to fourth output signals OUT0 to OUT3 in response to a clock CLK. The first to fourth selection signals SEL_IN0 to SEL_IN3 may be provided from corresponding input selectors. The first to fourth output signals OUT0 to OUT3 of the first to fourth flip-flops 21 to 24 may be provided to next stage input selectors, respectively.

The first to fourth output signals OUT0 to OUT3 and the first to fourth external input signals IN0 to IN3 may correspond one to one. Corresponding output signal and external input signal may share the same input/output pad (for example, a DQ pad) and may be inputted and outputted through the shared input/output pad.

Operation of the MISR circuit 10 will be described now with reference to FIGS. 1 and 2.

First, when the first input control signal M0 and the second input control signal M1 are a logic low level (e.g., '0'), the first to fourth input selectors 11 to 14 output all the first to fourth selection signals SEL_IN0 to SEL_IN3 at logic low levels ('0'). Accordingly, the MISR circuit 10 may perform a reset function.

When the first input control signal M0 is inputted at a logic high level (e.g., '1') and the second input control signal M1 is inputted at the logic low level ('0'), the first to fourth input selectors 11 to 14 output the output signals of the previous stage flip-flops as the first to fourth selection signals SEL_IN0 to SEL_IN3. Accordingly, the first to fourth flip-flops 21 to 24 may operate as shift registers which receive and output the output signals of the previous stage flip-flops based on the toggling of the clock CLK. In other words, the MISR circuit 10 may perform the function of a linear feedback shift register (LFSR). The third input selector 13 may selectively invert the output signal of the previous stage flip-flop (that is, the fourth output signal OUT3) depending on the logic level of the feedback signal FB, and may output the third selection signal SEL_IN2. The fourth input selector 14 may selectively invert the output signal of the previous stage flip-flop (that is, the signal of the level of the ground voltage VSS) depending on the logic level of the feedback signal FB, and may output the fourth selection signal SEL_IN3.

When the first input control signal M0 is inputted at the logic low level ('0') and the second input control signal M1 is inputted at the logic high level ('1'), the first to fourth input selectors 11 to 14 provide the first to fourth selection signals SEL_IN0 to SEL_IN3 by selecting the first to fourth external input signals IN0 to IN3. The first to fourth flip-flops 21 to 24 may store the first to fourth selection signals SEL_IN0 to SEL_IN3 based on the toggling of the clock CLK. In other words, the MISR circuit 10 may perform a simple register function.

When the first input control signal M0 and the second input control signal M1 are inputted at the logic high level ('1'), the first to fourth input selectors 11 to 14 provide the first to fourth selection signals SEL_IN0 to SEL_IN3 by combining the first to fourth output signals OUT0 to OUT3 outputted from the previous stage flip-flops and the first to fourth external input signals IN0 to IN3 depending on the feedback signal FB. Accordingly, the MISR circuit 10 may perform the function of a multiple-input shift register (MISR). The third input selector 13 selector may selectively invert the output signal of the previous stage flip-flop (that is, the fourth output signal OUT3) depending on the logic level of the feedback signal FB. Then, the third input selector 13 may combine the selectively inverted output signal with the third external input signal IN2 and output the third selection signal SEL_IN2. The fourth input selector 14 may selectively invert the output signal of the previous stage flip-flop (that is, the signal of the level of the ground voltage VSS) depending on the logic level of the feedback signal FB. Then, the fourth input selector 14 may combine the selectively inverted output signal with the fourth external input signal IN3 and output the fourth selection signal SEL_IN3.

As described above, the MISR circuit 10 may perform the MISR function depending on the logic levels of the first and second input control signals M0 and M1.

Recently, IEEE Standard 1500 for an embedded core test has been proposed. For a read operation of the IEEE Standard 1500 (IEEE 1500 read operation), the MISR circuit shown in FIG. 1 may be used. In other words, an internal set value (that is, target data) of a semiconductor device may be read and provided to an external device (for example, a controller) by using the registers of an MISR circuit. The IEEE 1500 read operation is for reading target data such as a temperature and a voltage in the semiconductor device, and providing such data to the external device. In order to perform the IEEE 1500 read operation, it is essential to store the read target data in internal registers (or flip-flops) and then read the stored target data. Accordingly, a method of storing the read target data in the registers of the MISR circuit included in the semiconductor device and then reading the stored target data to the external device is provided. While the present invention has particular applicability to an IEEE 1500 read operation, the present invention is not so limited. Rather, aspects of the present invention may be used in connection with other types of read operations including a read operation equivalent to that of the IEEE 1500 standard.

Figure 3:
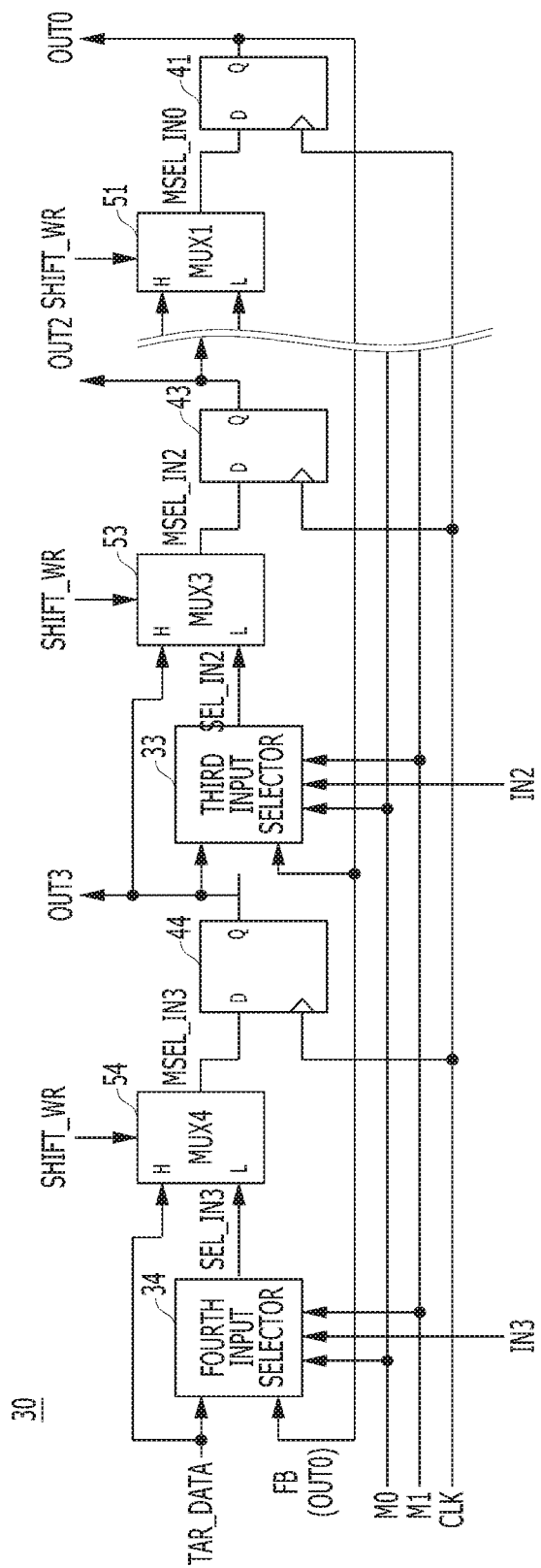
FIG. 3 is a block diagram illustrating a multiple-input shift register (MISR) circuit supporting an IEEE 1500 type read operation.

FIG. 3 is a block diagram illustrating a multiple-input shift register (MISR) circuit 30 supporting an IEEE 1500 read operation.

Referring to FIG. 3, the MISR circuit 30 may include a plurality of input selectors, a plurality of flip-flops and multiplexers which are alternatively coupled in series with one another. FIG. 3 illustrates that the MISR circuit 30 includes first to fourth input selectors 31 to 34, first to fourth flip-flops 41 to 44 and first to fourth multiplexers (MUX1 to MUX4) 51 to 54, The MISR circuit 30 may store and output four bits.

Compared to the MISR circuit 10 of FIG. 1, the MISR circuit 30 of FIG. 3 is different in that the first to fourth multiplexers 51 to 54 are disposed between the first to fourth input selectors 31 to 34 and the first to fourth flip-flops 41 to 44. The first to fourth input selectors 31 to 34, the first to fourth flip-flops 41 to 44 and the first to fourth multiplexers 51 to 54 may correspond one to one.

The first to fourth multiplexers 51 to 54 may respectively select any one of a signal inputted to a first input terminal and a signal inputted to a second input terminal, depending on a mode control signal SHIFT_WR. The first to fourth multiplexers 51 to 54 may output first to fourth mux selection signals MSEL_IN0 to MSEL_IN3, respectively. The first to third multiplexers 51 to 53 may respectively receive second to fourth output signals OUT1 to OUT3 which are outputted from previous stage flip-flops, through first input terminals (H). The fourth multiplexer 54 may receive target data TAR_DATA which is read in the semiconductor device, through the first input terminal. The first to fourth multiplexers 51 to 54 may respectively receive first to fourth selection signals SEL_IN0 to SEL_IN3, which are outputted from the first to fourth input selectors 31 to 34, through second input terminals (L).

For example, the third multiplexer 53 may select one of the fourth output signal OUT3 outputted from the fourth flip-flop 44 and the third selection signal SEL_IN2 outputted from the third input selector 33, based on the mode control signal SHIFT_WR. The third multiplexer 53 may provide the selected signal to the third flip-flop 43 as the third mux selection signal MSEL_IN2. The mode control signal SHIFT_WR may be at a logic high level when performing the IEEE 1500 read operation and at a logic low level when the MISR circuit operates (that is, when performing an MISR logical operation).

The first to fourth output signals OUT0 to OUT3 and first to fourth external input signals IN0 to IN3 may correspond one to one. Corresponding output signal and external input signal may share the same input/output pad (for example, a DQ pad) and may be inputted/outputted through the shared input/output pad. Accordingly, when performing the MISR logical operation, the first to fourth output signals OUT0 to OUT3 may be outputted to an external device through input/output pads, or the first to fourth external input signals IN0 to IN3 may be inputted from the external device through the same input/output pads. When performing the IEEE 1500 read operation, the first output signal OUT0 may be outputted to the external device through a test input/output pad separated from the input/output pad (for example, a WSO pad).

Operation of the MISR circuit 30 will be described now with reference to FIG. 3.

When the mode control signal SHIFT_WR becomes the logic high level to perform the IEEE 1500 read operation, the fourth multiplexer 54 receives the target data TAR_DATA read in the semiconductor device, through the first input terminal (H), and provides the fourth mux selection signal MSEL_N3 to the fourth flip-flop 44. The fourth flip-flop 44 may output the fourth mux selection signal MSEL_IN3 as the fourth output signal OUT3 in response to first toggling of the clock CLK.

Similarly, the third multiplexer 53 receives the fourth output signal OUT3 outputted from the fourth flip-flop 44, through the first input terminal (H), and provides the third mux selection signal MSEL_IN2 to the third flip-flop 43. The third flip-flop 43 may output the third mux selection signal MSEL_IN2 as the third output signal OUT2 in response to second toggling of the clock CLK. In this manner, after the clock CLK toggles four times, the target data TAR_DATA may be outputted as the first output signal OUT0 to the external device through the test input/output pad. Accordingly, the MISR circuit 30 may perform the IEEE 1500 read operation of reading out the target data TAR_DATA read in the semiconductor device.

Conversely, when the mode control signal SHIFT_WR becomes the logic low level to perform the MISR logical operation, the first to fourth multiplexers 51 to 54 may respectively receive the first to fourth selection signals SEL_IN0 to SEL_IN3 outputted from the first to fourth input selectors 31 to 34 through the second input terminals (L). Accordingly, the MISR circuit 30 may perform the MISR logical operation described above with reference to FIG. 2 depending on the logic levels of first and second input control signals M0 and M1.

However, as described above, when the first to fourth multiplexers 51 to 54 which one-to-one correspond to the first to fourth input selectors 31 to 34 and the first to fourth flip-flops (or registers) 41 to 44 are disposed, an area occupied by the MISR circuit 30 increases. In addition, because signals are transmitted through respective multiplexers when performing the MISR logical operation, an MISR operation delay occurs.

Accordingly, an embodiment of the present invention is directed to an MISR circuit capable of supporting an IEEE 1500 read operation and performing an MISR logical operation while minimizing an area increase and a signal delay.

Figure 4:
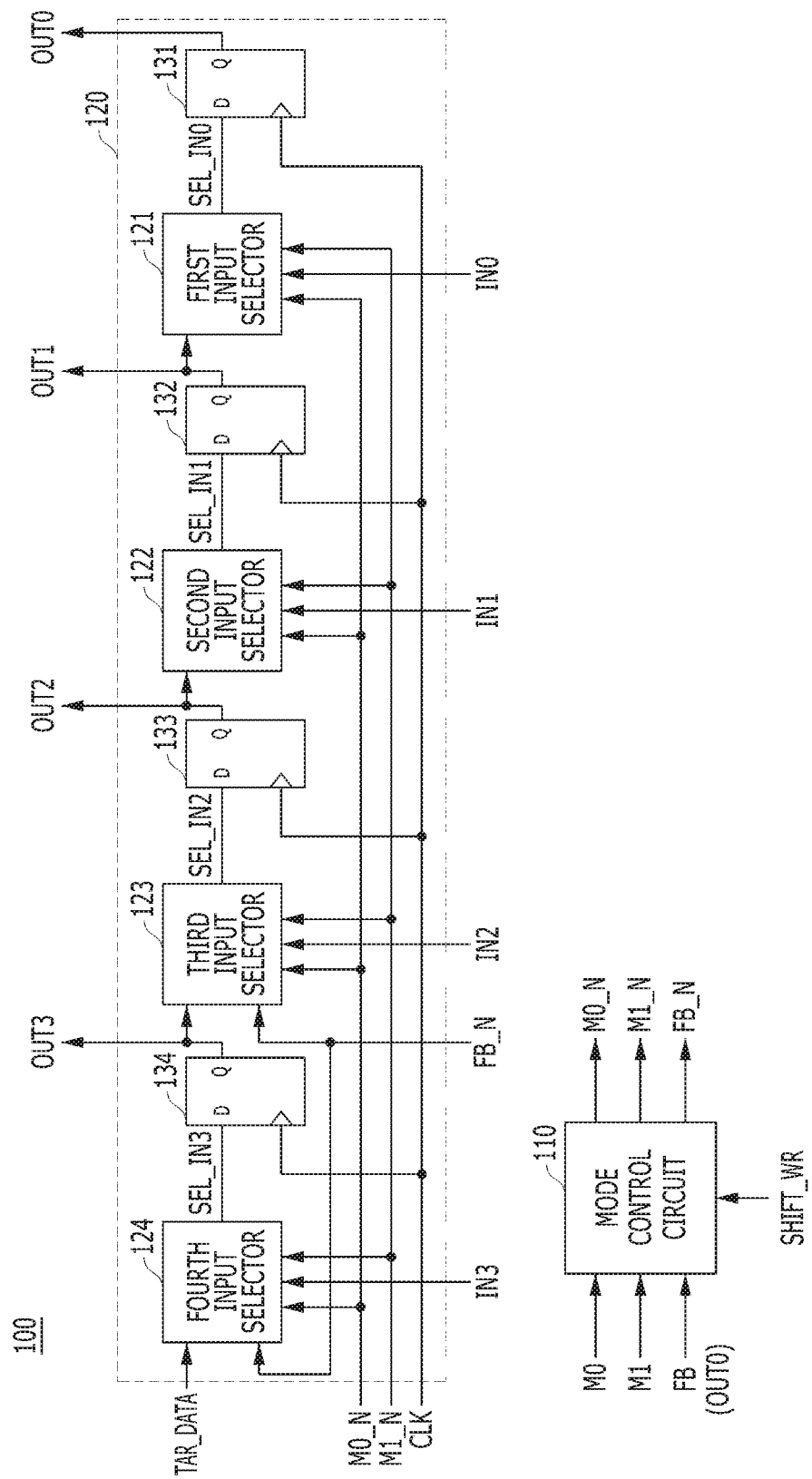
FIG. 4 is a block diagram illustrating a semiconductor device including an MISR circuit supporting an IEEE 1500 type read operation in accordance with an embodiment.

FIG. 4 is a block diagram illustrating a semiconductor device 100 including an MISR circuit 120 supporting an IEEE 1500 read operation in accordance with an embodiment.

Referring to FIG. 4, the semiconductor device 100 may include a mode control circuit 110, and the MISR circuit 120.

The mode control circuit 110 may selectively mask a first initial input control signal M0, a second initial input control signal M1 and an initial feedback signal FB depending on a mode control signal SHIFT_WR, and output a first input control signal M0_N, a second input control signal M1_N and a feedback signal FB_N. The mode control signal SHIFT_WR may be at a logic high level when performing the IEEE 1500 read operation and be at a logic low level when operating as an MISR circuit (that is, when performing an MISR logical operation).

When the mode control signal SHIFT_WR becomes the logic high level to perform the IEEE 1500 read operation, the mode control circuit 110 may output the first and second initial input control signals M0 and M1 and the initial feedback signal FB as the first and second input control signals M0_N and M1_N and the feedback signal FB_N, respectively. When the mode control signal SHIFT_WR becomes the logic low level to perform the MISR logical operation, the mode control circuit 110 may output the first and second input control signals M0_N and M1_N and the feedback signal FB_N by masking the first and second initial input control signals M0 and M1 and the initial feedback signal FB to respective specific levels. For example, the mode control circuit 110 may output the first input control signal M0_N by activating the first initial input control signal M0 to a logic high level and may output the second input control signal M1_N and the feedback signal FB_N by deactivating the second initial input control signal M1 and the initial feedback signal FB to logic low levels.

The MISR circuit 120 may include a plurality of input selectors and a plurality of registers which are alternately coupled in series with one another. The plurality of input selectors and the plurality of registers may correspond one to one. A case where each of the plurality of registers is configured by a flip-flop which operates in synchronization with a clock CLK will be described as an example. However, the present invention is not limited thereto, and each of the registers may be implemented as a component which performs an operation of storing data or outputting stored data depending on a clock.

The MISR circuit 120 may include first to fourth input selectors 121 to 124 and first to fourth flip-flops 131 to 134 and may store and output four bits. First to fourth output signals OUT0 to OUT3 may be outputted from output terminals of the first to fourth flip-flops 131 to 134, respectively. The first output signal OUT0 is outputted from a last stage flip-flop (that is, the first flip-flop 131) of the first to fourth flip-flops 131 to 134. The first output signal OUT0 may be provided as the initial feedback signal FB. Since the third input selector 123 and the fourth input selector 124 selector receive the feedback signal FB_N, the MISR circuit 120 may be described mathematically by a polynomial: $f(x)=X^4+X^3+1$.

The first to fourth input selectors 121 to 124 may combine the first to fourth output signals OUT0 to OUT3 which are outputted from previous stage flip-flops and first to fourth external input signals IN0 to IN3, based on the first and second input control signals M0_N and M1_N and the feedback signal FB_N, and output first to fourth selection signals SEL_IN0 to SEL_IN3, respectively. For example, the third input selector 123 may combine the fourth output signal OUT3 outputted from the fourth flip-flop 134 and the third external input signal IN2 based on the first and second input control signals M0_N and M1_N and the feedback signal FB_N, and output the third selection signal SEL_IN2. The fourth input selector 124 is disposed at the foremost stage of the serial coupling. The fourth input selector 124 may receive target data TAR_DATA read in the semiconductor device as the output signal of the previous stage flip-flop. For reference, in the case of performing an MISR logical operation, the target data TAR_DATA may be fixed as a signal of the level of a ground voltage VSS. The first to fourth selection signals SEL_IN0 to SEL_IN3 may be provided as input signals of corresponding flip-flops, respectively.

The first to fourth flip-flops 131 to 134 may store the first to fourth selection signals SEL_IN0 to SEL_IN3 selector and output values stored therein as the first to fourth output signals OUT0 to OUT3, in response to the clock CLK. The first to fourth selection signals SEL_IN0 to SEL_IN3 may be provided from corresponding input selectors. The first to fourth output signals OUT0 to OUT3 of the first to fourth flip-flops 131 to 134 may be provided to next stage input selectors, respectively.

The first to fourth output signals OUT0 to OUT3 and the first to fourth external input signals IN0 to IN3 may correspond one to one. Corresponding output signal and external input signal may share the same input/output pad (for example, a DQ pad) and may be inputted and outputted through the shared input/output pad. Accordingly, when the MISR logical operation is performed, the first to fourth output signals OUT0 to OUT3 outputted from the first to fourth flip-flops 131 to 134 may be outputted to an external device through a plurality of input/output pads. Further, the first to fourth external input signals IN0 to IN3 may be inputted through the same plurality of input/output pads and be stored in the first to fourth flip-flops 131 to 134, respectively. When the IEEE 1500 read operation is performed, the first output signal OUT0 may be outputted to the external device through a separate test input/output pad (for example, a WSO pad).

Figure 5:
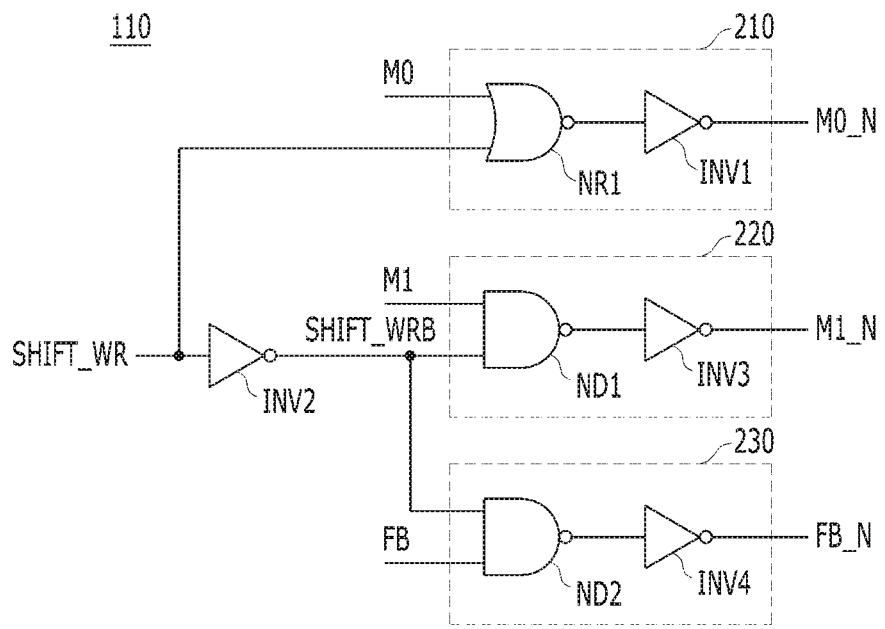
FIG. 5 is a circuit diagram illustrating a mode control circuit, such as that shown in FIG. 4, in accordance with an embodiment.

FIG. 5 is a circuit diagram illustrating a mode control circuit, e.g., the mode control circuit 110 shown in FIG. 4, in accordance with an embodiment.

Referring to FIG. 5, the mode control circuit 110 may include a first logic component 210, a second logic component 220 and a third logic component 230.

The first logic component 210 may perform an OR operation on the mode control signal SHIFT_WR and the first initial input control signal M0. The first logic component 210 may include a NOR gate NR1 and an inverter INV1. The NOR gate NR1 receives the mode control signal SHIFT_WR and the first initial input control signal M0, and performs a NOR operation on the received signals. Then, the inverter INV1 inverts the output of the NOR gate NR1.

The mode control signal SHIFT_WR may be inverted by an inverter INV2 and be outputted as an inverted mode control signal SHIFT_WRB.

The second logic component 220 may perform an AND operation on the inverted mode control signal SHIFT_WRB and the second initial input control signal M1. The second logic component 220 may include a NAND gate ND1 that receives the inverted mode control signal SHIFT_WRB and the second initial input control signal M1, and an inverter INV3 that inverts the output of the NAND gate ND1.

The third logic component 230 may perform an AND operation on the inverted mode control signal SHIFT_WRB and the initial feedback signal FB. For example, the third logic component 230 may include a NAND gate ND2 and an inverter INV4. The NAND gate ND2 receives the inverted mode control signal SHIFT_WRB and the initial feedback signal FB, and performs a NAND operation on the received signals. The inverter INV4 inverts the output of the NAND gate ND2.

Through the above-described configuration, when the mode control signal SHIFT_WR has the logic high level, the mode control circuit 110 may output the first and second initial input control signals M0 and M1 and the initial feedback signal FB as the first and second input control signals M0_N and M1_N and the feedback signal FB_N, respectively. When the mode control signal SHIFT_WR has the logic low level, the mode control circuit 110 may activate and output the first input control signal M0_N to the logic high level and deactivate and output the second input control signal M1_N and the feedback signal FB_N to the logic low levels.

Referring back to FIG. 4, the first to fourth input selectors 121 to 124 may be divided into two groups, one being the third and fourth input selectors 123 and 124, which receive the feedback signal FB_N, and the other being the first and second input selectors 121 and 122, which do not receive the feedback signal FB_N. The second input selector 122 and the third input selector 123 will be described as an example.

Figure 6:
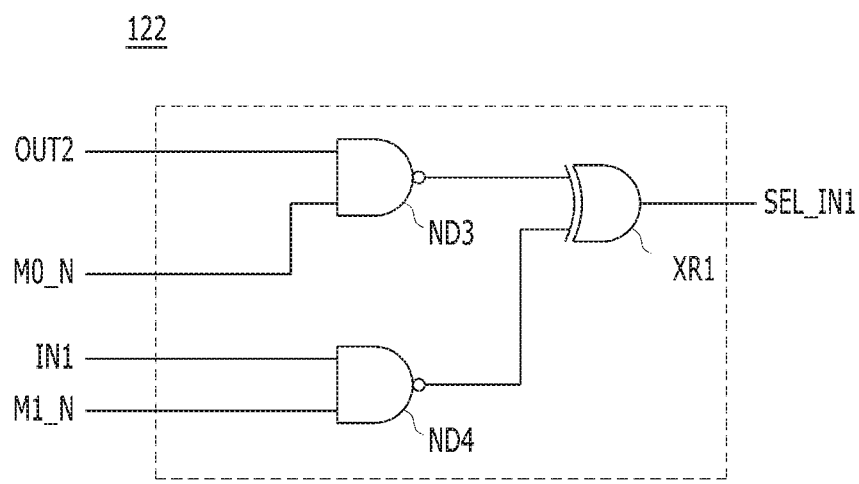
FIG. 6 is a circuit diagram illustrating a second input selector, such as that shown in FIG. 4, in accordance with an embodiment.

FIG. 6 is a circuit diagram illustrating a second input selector, e.g., the second input selector 122 shown in FIG. 4, in accordance with an embodiment.

Referring to FIG. 6, the second input selector 122 may include a first NAND gate ND3, a second NAND gate ND4 and an XOR gate XR1. The first NAND gate ND3 performs a NAND operation on the first input control signal M0_N and the third output signal OUT2 outputted from the third flip-flop 133. The second NAND gate ND4 performs the NAND operation on the second input control signal M1_N and the second external input signal IN1. The XOR gate XR1 performs an XOR operation on the outputs of the first NAND gate ND3 and the second NAND gate ND4 and outputs the second selection signal SEL_IN1.

The operation of the second input selector 122 having the above-described configuration will be described below.

When the first input control signal M0_N and the second input control signal M1_N are inputted at the logic low levels, the second input selector 122 outputs the second selection signal SEL_IN1 as a logic low level. Accordingly, the MISR circuit 120 including the second input selector 122 may perform a reset function.

When the first input control signal M0_N is inputted at the logic high level and the second input control signal M1_N is inputted at the logic low level, the second input selector 122 outputs the third output signal OUT2 as the second selection signal SEL_IN1. Accordingly, the MISR circuit 120 including the second input selector 122 may perform the function of a linear feedback shift register (LFSR).

When the first input control signal M0_N is inputted at the logic low level and the second input control signal M1_N is inputted at the logic high level, the second input selector 122 outputs the second external input signal IN1 as the second selection signal SEL_IN1. Accordingly, the MISR circuit 120 including the second input selector 122 may perform a register function.

When the first input control signal M0_N and the second input control signal M1_N are inputted at the logic high levels, the second input selector 122 outputs the second selection signal SEL_IN1 depending on the logic levels of the third output signal OUT2 and the second external input signal IN1. Accordingly, the MISR circuit 120 including the second input selector 122 may perform the function of a multiple-input shift register (MISR).

Figure 7:
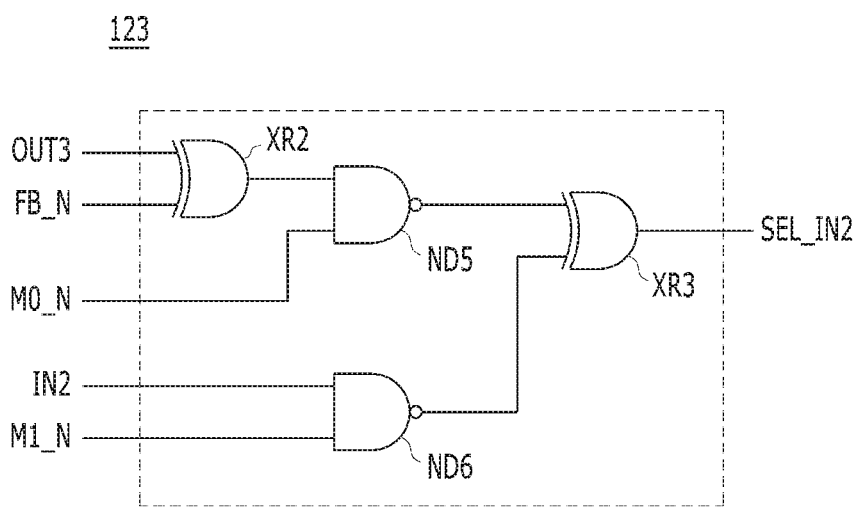
FIG. 7 is a circuit diagram illustrating a third input selector, such as that shown in FIG. 4, in accordance with an embodiment.

FIG. 7 is a circuit diagram illustrating a third input selector, e.g., the third input selector 123 shown in FIG. 4, in accordance with an embodiment.

Referring to FIG. 7, the third input selector 123 may include a first XOR gate XR2, a first NAND gate ND5, a second NAND gate ND6, and a second XOR gate XR3. The first XOR gate XR2 performs an XOR operation on the feedback signal FB_N and the fourth output signal OUT3 that is outputted from the fourth flip-flop 134. The first NAND gate ND5 performs a NAND operation on the output of the first XOR gate XR2 and the first input control signal M0_N. The second NAND gate ND6 performs a NAND operation on the second input control signal M1_N and the third external input signal IN2. The second XOR gate XR3 performs an XOR operation on the outputs of the first NAND gate ND5 and second NAND gate ND6 and outputs the third selection signal SEL_IN2.

The operation of the third input selector 123 having the above-described configuration will be described below.

When the first input control signal M0_IN and the second input control signal M1_N are inputted at the logic low level, the third input selector 123 outputs the third selection signal SEL_IN2 as a logic low level. Accordingly, the MISR circuit 120 including the third input selector 123 may perform a reset function.

When the first input control signal M0_N is inputted at the logic high level and the second input control signal M1_N is inputted at the logic low level, the third input selector 123 outputs the third selection signal SEL_IN2 based on a logic level of the fourth output signal OUT3 and the feedback signal FB_N. The third input selector 123 may selectively invert the fourth output signal OUT3 based on the logic level of the feedback signal FB_N and output an inverted signal as the third selection signal SEL_IN2. Accordingly, the MISR circuit 120 including the third input selector 123 may perform the function of a linear feedback shift register (LFSR).

When the first input control signal M0_N is inputted at the logic low level and the second input control signal M1_N is inputted at the logic high level, the third input selector 123 outputs the third external input signal IN2 as the third selection signal SEL_IN2. Accordingly, the MISR circuit 120 including the third input selector 123 may perform a register function.

When the first input control signal M0_N and the second input control signal M1_N are inputted at the logic high level, the third input selector 123 outputs the third selection signal SEL_IN2 based on a logic level of the fourth output signal OUT3 and the third external input signal IN2. In this case, the third input selector 123 may selectively invert the fourth output signal OUT3 based on the logic level of the feedback signal FB_N. Subsequently, the third input selector 123 may combine the inverted signal with the third external input signal IN2 to output as the third selection signal SEL_IN2. Accordingly, the MISR circuit 120 including the third input selector 123 may perform the function of a multiple-input shift register (MISR).

For more efficient manufacturing, assembly and processing, the first to fourth input selectors 121 to 124 of FIG. 4 may be implemented with the same configuration. In this case, the first to fourth input selectors 121 to 124 may be implemented with the configuration of FIG. 7. Also, the first and second input selectors 121 and 122 which do not receive the feedback signal FB_N may receive the signal of the level of the ground voltage VSS instead of the feedback signal FB_N.

The operation of the semiconductor device 100 shown in FIG. 4 will be described now with reference to FIGS. 4 to 7.

When the mode control signal SHIFT_WR has the logic high level to perform the IEEE 1500 read operation, the mode control circuit 110 may activate and output the first input control signal M0_N to the logic high level and deactivate and output the second input control signal M1_N and the feedback signal FB_N to the logic low level.

The fourth input selector 124 receives the target data TAR_DATA in the semiconductor device and provides the target data TAR_DATA to the fourth flip-flop 134 as the fourth selection signal SEL_IN3. The fourth flip-flop 134 may output the fourth selection signal SEL_IN3 as the fourth output signal OUT3 in response to first toggling of the clock CLK.

The third input selector 123 may receive the fourth output signal OUT3 from the fourth flip-flop 134, and output the fourth output signal OUT3 as the third selection signal SEL_IN2. The third flip-flop 133 may output the third selection signal SEL_IN2 as the third output signal OUT2 in response to second toggling of the clock CLK. In this manner, after the clock CLK toggles four times, the is target data TAR_DATA may be outputted as the first output signal OUT0 to the external device through the test input/output pad. Accordingly, the MISR circuit 120 may perform the IEEE 1500 read operation of reading the target data TAR_DATA read in the semiconductor device.

Conversely, when the mode control signal SHIFT_WR has the logic low level to perform the MISR logical operation, the mode control circuit 110 may output the first and second initial input control signals M0 and M1 and the initial feedback signal FB as the first and second input control signals M0_N and M1_N and the feedback signal FB_N, respectively.

In this regard, the first to fourth input selectors 121 to 124 may combine the first to fourth output signals OUT0 to OUT3 which are outputted from the previous stage flip-flops and the first to fourth external input signals IN0 to IN3, based on the first and second input control signals M0_N and M1_N and the feedback signal FB_N. Then, the first to fourth input selectors 121 to 124 may output the first to fourth selection signals SEL_IN0 to SEL_IN3, respectively. The first to fourth flip-flops 131 to 134 may store the first to fourth selection signals SEL_IN0 to SEL_IN3 provided from the previous stage input selectors or output the values stored therein as the first to fourth output signals OUT0 to OUT3, in response to the clock CLK. Accordingly, the MISR circuit 120 may perform an MISR logical operation based on the logic levels of the first and second input control signals M0_N and M1_N.

As described above, in an embodiment, an IEEE 1500 read operation may be performed using the registers of the MISR circuit without multiplexers. Therefore, a circuit area may be reduced, the speeds of an MISR logical operation and a read operation may be increased, and a delay in the MISR logical operation is prevented, thereby preventing deterioration of signal integrity (SI) characteristics.

Figure 8:
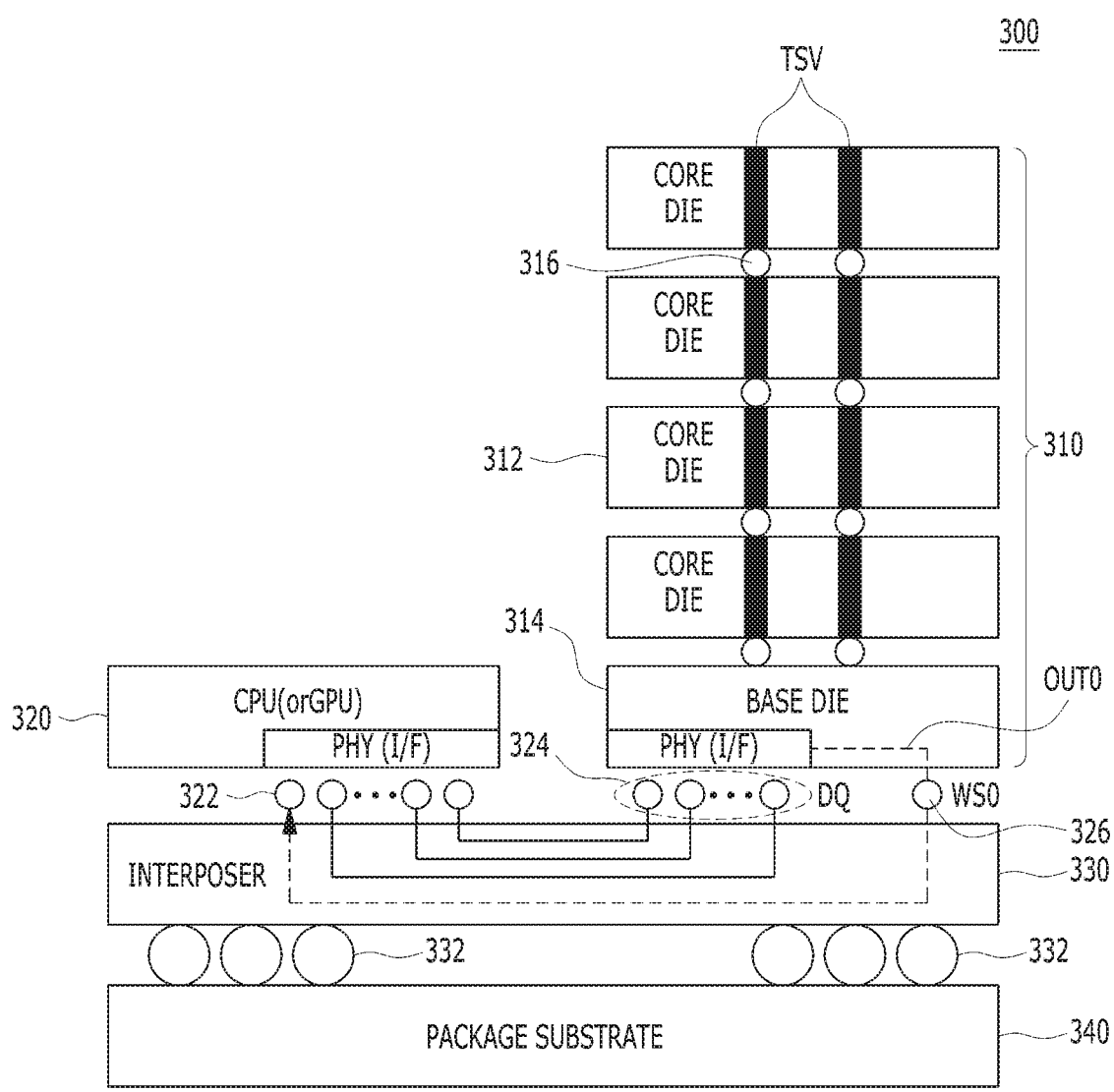
FIG. 8 is a diagram illustrating a memory system configured as a high bandwidth memory (HBM) in accordance with an embodiment.

FIG. 8 is a diagram illustrating a memory system 300 configured as a high bandwidth memory (HBM) in accordance with an embodiment.

Referring to FIG. 8, the memory system 300 may include a stack type memory device 310, a memory controller 320, an interposer 330 and a package substrate 340. The memory system 300 may be implemented in any of a variety of forms such as a system-in-package (SIP), a mufti-chip package (MCP), a system-on-chip (SoC) and a package-on-package (PoP) including a plurality of packages.

The interposer 330 may be formed over the package substrate 340. The interposer 330 and the package substrate 340 may be coupled to each other through electric coupling means 332 such as bump balls, a ball grid array and C4 bumps. The interposer 330 and the package substrate 340 may form signal paths for transmitting signals. Although not illustrated, the package substrate 340 may include package balls, and the memory system 300 may be coupled with an external electronic device through the package balls.

The stack type memory device 310 and the memory controller 320 may be formed over the interposer 330. The stack type memory device 310 and the memory controller 320 may be electrically coupled through micro bump pads 322. Respective physical regions PHY of the stack type memory device 310 and the memory controller 320 may be coupled through the signal paths formed in the interposer 330.

The stack type memory device 310 may be configured in the form of a high bandwidth memory (HBM) in which a bandwidth is increased by increasing the number of input/output units through stacking a plurality of dies and electrically coupling the dies through through-electrodes or through-silicon vias (TSVs).

The plurality of dies may include a base die 314 and a plurality of core dies 312. The core dies 312 may be stacked over the base die 314 and be coupled with one another through micro bump pads 316 and through-silicon vias TSV. A plurality of memory cells for storing data and circuits for read/write operations of the memory cells may be disposed in each of the core dies 312. Circuits for interfacing the core dies 312 and the memory controller 320 may be mounted in the base die 314. Accordingly, various functions in the memory system 300, for example, a memory management function such as power management and refresh of the memory cells and a timing control function between the core dies 312 and the memory controller 320, may be performed.

The memory controller 320 may be a master device which controls the stack type memory device 310. The memory controller 320 may be a central processing unit (CPU), a graphic processing unit (GPU), a digital signal processor (DSP), an application processor (AP), a controller chip, or a memory controller chip.

Interface circuits I/F for electrically exchanging signals through micro bump pads 322 may be included in the physical regions PHY of the base die 314 and the memory controller 320. The base die 314 and the memory controller 320 may exchange data DQ, a data strobe signal DQS, a clock signal CK, a command signal CMD and an address signal ADD through the interface circuits I/F and the micro bump pads 322.

Particularly, the mode control circuit 110 and the MISR circuit 120 described above with reference to FIG. 4 may be disposed in the interface circuit I/F of the base die 314. According to an embodiment, only the MISR circuit 120 may be disposed in the interface circuit I/F of the base die 314, and the mode control circuit 110 may be disposed at the periphery of the physical region PHY.

The micro bump pads 322 may include input/output pads 324 (for example, a plurality of DQ pads) which are used when performing an MISR logical operation and a separate test input/output pad 326 (for example, a WSO pad) which is used when performing the IEEE 1500 read operation. The WSO pad 326 as a pad used in a test operation may be driven at a relatively low speed in comparison with the DQ pads 324.

When the mode control signal SHIFT_WR becomes a logic low level and the MISR logical operation is performed, the MISR circuit 120 of FIG. 4 may input/output the first to fourth output signals OUT0 to OUT3 and the first to fourth external input signals IN0 to IN3 through the plurality of DQ pads 324. That is to say, the MISR circuit 120 may output the first to fourth output signals OUT0 to OUT3 outputted from the first to fourth flip-flops 131 to 134, to the memory controller 320 through the plurality of DQ pads 324. Further, the MISR circuit 120 may store the first to fourth external input signals IN0 to IN3 inputted from the memory controller 320 through the same plurality of DQ pads 324, in the first to fourth flip-flops 131 to 134.

When the mode control signal SHIFT_WR becomes a logic high level and the IEEE 1500 read operation is performed, the MISR circuit 120 may output the first output signal OUT0 in the form of a signal to be used in the IEEE 1500 read operation, to the memory controller 320 through the WSO pad 326. The memory controller 320 may reset the temperature, voltage or the like of the stack type memory device 310 based on a received signal.

As is apparent from the above description, in a semiconductor device according to embodiments, by performing an IEEE 1500 or equivalent read operation using the registers of an MISR circuit even without including multiplexers, a circuit area may be reduced, the is speeds of an MISR logical operation and a read operation may be increased, and a delay in the MISR logical operation is prevented, thereby preventing deterioration of signal integrity (SI) characteristics.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

For example, while it is explained in the above-described embodiment of the present disclosure that a semiconductor memory device is divided into two bank groups and each of the bank groups includes fourth banks, it is to be noted that this is merely an example. Embodiments of the present invention may include arrangements in which more or fewer bank groups are included in a semiconductor memory device and arrangements in which a larger or smaller number of banks are included in each bank group.

What is claimed is:

1. A semiconductor device comprising:
    a mode control circuit suitable for selectively masking first and second initial input control signals and an initial feedback signal depending on a mode control signal and outputting first and second input control signals and a feedback signal; and
    a multiple-input shift register (MISR) circuit including a plurality of input selectors and a plurality of registers which are alternatively coupled in series with one another, wherein each of the plurality of input selectors combines an output signal of a previous stage register among the plurality of registers and an external input signal depending on the first and second input control signals and the feedback signal and provides an input signal for a next stage register among the plurality of registers.

2. The semiconductor device of claim 1,
    wherein the mode control circuit outputs the first and second initial input control signals and the initial feedback signal as the first and second input control signals and the feedback signal, respectively, according to the mode control signal having a first logic level, and
    wherein the mode control circuit outputs the first and second input control signals and the feedback signal by masking the first and second initial input control signals and the initial feedback signal to specific levels, respectively, according to the mode control signal having a second logic level.

3. The semiconductor device of claim 2, wherein the mode control circuit activates and outputs the first input control signal and deactivates and outputs the second input control signal and the feedback signal based on the mode control signal having the second logic level.

4. The semiconductor device of claim 1,
    wherein the mode control signal is at a first logic level when performing an MISR logical operation, and
    wherein the mode control signal is at a second logic level when performing a read operation of reading out target data in the semiconductor device and outputting the target data to an external device.

5. The semiconductor device of claim 4, wherein, when performing the read operation, an output signal of a last stage register among the plurality of registers is provided to the external device through a test input/output pad.

6. The semiconductor device of claim 1, wherein an output signal of a last stage register among the plurality of registers is provided as the initial feedback signal.

7. The semiconductor device of claim 1, wherein an input selector, which is positioned at a foremost stage of serial coupling, receives target data read in the semiconductor device as an output signal of a previous stage flip-flop.

8. The semiconductor device of claim 1, wherein each of the plurality of input selectors selects a signal which is obtained by combining the feedback signal and an output signal of a previous stage register depending on the first input control signal, and selects the external input signal depending on the second input control signal.

9. The semiconductor device of claim 1, wherein the mode control circuit comprises:
    a first logic component suitable for performing an OR operation on the mode control signal and the first initial input control signal to output the first input control signal;
    a second logic component suitable for performing an AND operation on an inverted mode control signal and the second initial input control signal to output the second input control signal; and a third logic component suitable for performing an AND operation on the inverted mode control signal and the initial feedback signal to output the feedback signal.

10. The semiconductor device of claim 1, wherein at least one of the plurality of input selectors comprises:
a first logic gate suitable for performing a NAND operation on the first input control signal and an output signal of a previous stage register;
a second logic gate suitable for performing a NAND operation on the second input control signal and the external input signal; and
a third logic gate suitable for performing an XOR operation on outputs of the first logic gate and the second logic gate to provide an input signal to a next stage register.

11. The semiconductor device of claim 1, wherein at least one of the plurality of input selectors comprises:
a fourth logic gate suitable for performing an XOR operation on the feedback signal and an output signal of a previous stage register;
a fifth logic gate suitable for performing a NAND operation on an output of the fourth logic gate and the first input control signal;
a sixth logic gate suitable for performing a NAND operation on the second input control signal and the external input signal; and
a seventh logic gate suitable for performing an XOR operation on outputs of the fifth logic gate and the sixth logic gate to provide an input signal to a next stage register.

12. The semiconductor device of claim 1, wherein the MISR circuit performs one of a reset function, a linear feedback shift register (LFSR) function, a register function and an MISR function, depending on the first and second input control signals.

13. A memory system, comprising:
a memory controller; and
a stack type memory device including a base die and a plurality of core dies which are stacked on the base die to transmit signals through a plurality of through-electrodes,
wherein the base die comprises:
a mode control circuit suitable for selectively masking first and second initial input control signals and an initial feedback signal depending on a mode control signal, and outputting first and second input control signals and a feedback signal; and
a multiple-input shift register (MISR) circuit including a plurality of input selectors and a plurality of registers which are alternatively coupled in series with one another, and suitable for selectively performing an MISR logical operation or a register read operation depending on the first and second input control signals and the feedback signal.

14. The memory system of claim 13,
wherein the mode control circuit outputs the first and second initial input control signals and the initial feedback signal as the first and second input control signals and the feedback signal, respectively, according to the mode control signal having a first logic level, and
wherein the mode control circuit outputs the first and second input control signals and the feedback signal by masking the first and second initial input control signals and the initial feedback signal to specific levels, respectively, according to the mode control signal having a second logic level.

15. The memory system of claim 14, wherein the mode control circuit activates and outputs the first input control signal and deactivates and outputs the second input control signal and the feedback signal, based on the mode control signal having the second logic level.

16. The memory system of claim 13, wherein the register read operation includes reading target data in the memory device.

17. The memory system of claim 13, wherein, when performing the register read operation, the MISR circuit provides an output signal of a last stage register among the plurality of registers to the memory controller through a test input/output pad.

18. The memory system of claim 13, wherein each of the plurality of input selectors combines an output signal of a previous stage register and an external input signal depending on the first and second input control signals and the feedback signal and provides an input signal of a next stage register among the plurality of registers.

19. The memory system of claim 18, wherein, when performing the MISR logical operation, the MISR circuit outputs output signals of the plurality of registers to the memory controller through a plurality of input/output pads, and stores the external input signals inputted from the memory controller through the plurality of input/output pads in the plurality of registers.

20. The memory system of claim 13, wherein the MISR logical operation includes one of a reset function, a linear feedback shift register (LFSR) function, a register function and an MISR function, depending on the first and second input control signals.

21. A semiconductor device comprising:
a mode control circuit suitable for generating at least one control signal based on a mode signal; and
a register circuit including a plurality of stages including a first stage, a second stage and a third stage coupled in series;
wherein, in response to the control signal having a first level,
the third stage receives and stores read data of the semiconductor device, and output the stored read data as third data to the second stage,
the second stage receives and stores the third data from the third stage, and output the stored third data as second data to the first stage, and
the first stage receives and stores the second data from the second stage, and output the stored second data as first data to a test pad; and
wherein, in response to the control signal having a second level,
the third stage receives and combines a first output signal from the first stage and a third external input signal, and outputs a third output signal,
the second stage receives and combines the third output signal from the third stage and a second external input signal, and outputs a second output signal, and
the first stage receives and combines the second output signal and a first external input signal, and outputs the first output signal.

22. The semiconductor device of claim 21, wherein the first stage includes a first input selector and a first register in series, the second stage includes a second input selector and a second register in series, and the third stage includes a third input selector and a third register in series, the third register coupled to the second input selector, and the second register coupled to the first input selector.

\* \* \* \* \*